United States Patent
Moratalla Martinez et al.

(10) Patent No.: US 10,449,625 B2
(45) Date of Patent: Oct. 22, 2019

(54) PRODUCTION METHOD FOR MAGNETIC INDUCTOR

(71) Applicant: GH Electrotermia, S.A., Valencia (ES)

(72) Inventors: Pedro Moratalla Martinez, Valencia (ES); Juan Carlos Rodríguez Lara, Valencia (ES); César Cases Sanchís, Valencia (ES); José Miguel Magraner Cáceres, Valencia (ES); Miguel Mezquida Gisbert, Valencia (ES)

(73) Assignee: GH Electrotermia, S.A., Valencia (ES)

( * ) Notice: Subject to any disclaimer, the term of this patent is extended or adjusted under 35 U.S.C. 154(b) by 278 days.

(21) Appl. No.: 15/505,681

(22) PCT Filed: Nov. 19, 2015

(86) PCT No.: PCT/ES2015/070824
§ 371 (c)(1),
(2) Date: Feb. 22, 2017

(87) PCT Pub. No.: WO2016/079360
PCT Pub. Date: May 26, 2016

(65) Prior Publication Data
US 2017/0282285 A1    Oct. 5, 2017

(30) Foreign Application Priority Data
Nov. 20, 2014 (ES) .................. 201431713

(51) Int. Cl.
*H01F 7/06* (2006.01)
*B23K 15/06* (2006.01)
(Continued)

(52) U.S. Cl.
CPC .............. *B23K 15/06* (2013.01); *B22F 3/105* (2013.01); *B22F 5/106* (2013.01); *H01F 5/00* (2013.01);
(Continued)

(58) Field of Classification Search
CPC . B22F 3/105; B22F 7/08; B33Y 10/00; B29C 64/00; H01F 1/00; H01F 41/00; C22C 2202/02; Y10T 29/4902
(Continued)

(56) References Cited

U.S. PATENT DOCUMENTS 5,102,449 A * 4/1992 Ducrocq ............... C21C 5/5241
  75/10.18
6,904,955 B2 * 6/2005 Jackson ................ B22D 41/00
  164/514
(Continued)

FOREIGN PATENT DOCUMENTS

WO    2014052323 A1    4/2014
WO    2014131444 A1    9/2014

OTHER PUBLICATIONS

Frigola et al., Fabricating Copper Components with Electron Beam Melting, Advanced Materials & Processes, Jul. 2014, pp. 20-24.
(Continued)

*Primary Examiner* — Thiem D Phan
(74) *Attorney, Agent, or Firm* — The Webb Law Firm

(57) ABSTRACT

A magnetic inductor for heating parts by means of induction having a geometry with a density greater than or equal to 99.9% (absence of pores), produced by a plurality of welded layers formed by metal dust particles of a conductive, non-magnetic material (such as, inter alia, copper, tin, aluminum, gold, or silver), preferably copper or a copper-based alloy, having a spherical shape and a grain size between 40 and 100 μm, and in a single-piece part including electrical and mechanical connections. Also, a method for producing the magnetic inductor with EBM technology (electron beam melting/production technology based on electron beam
(Continued)

fusion), using a system comprising an electron gun, a vacuum chamber, a working chamber and a manipulation system.

11 Claims, 2 Drawing Sheets

(51) Int. Cl.
    *B22F 3/105*     (2006.01)
    *H01F 5/00*     (2006.01)
    *B22F 5/10*     (2006.01)
    *H05B 6/36*     (2006.01)
    *H05B 6/42*     (2006.01)
    *H01F 41/00*     (2006.01)
    *H01F 1/00*     (2006.01)
    *H01J 37/317*     (2006.01)
(52) U.S. Cl.
    CPC ............... *H01F 41/00* (2013.01); *H05B 6/36* (2013.01); *H05B 6/42* (2013.01); *B22F 3/1055* (2013.01); *B22F 2998/10* (2013.01); *B22F 2999/00* (2013.01); *H01F 1/00* (2013.01); *H01J 37/3178* (2013.01); *Y02P 10/295* (2015.11); *Y10T 29/4902* (2015.01)
(58) Field of Classification Search
    USPC ................ 29/602.1, 603.13, 603.14, 603.16
    See application file for complete search history.

(56) References Cited

U.S. PATENT DOCUMENTS 8,642,916 B2 *    2/2014    Forbes Jones .......... B22D 11/11
                                                                                         219/121.17
2014/0302258 A1    10/2014    Mathieu et al.

OTHER PUBLICATIONS

Liang et al., 3D Printed Air Core Inductors for High Frequency Power Converters, IEEE, 2014, pp. 971-979.
Ramirez et al., Novel precipitate-microstructural architecture developed in the fabrication of solid copper components by additive manufacturing using electron beam melting, Acta Materialia, 2011, pp. 4088-4099, vol. 59, Publ. By Elsevier Ltd.

* cited by examiner

PRODUCTION METHOD FOR MAGNETIC INDUCTOR

CROSS-REFERENCE TO RELATED APPLICATIONS

This application is the United States national phase of International Application No. PCT/ES2015/070824 filed Nov. 19, 2015, and claims priority to Spanish Patent Application No. P201431713 filed Nov. 20, 2014, the disclosures of which are hereby incorporated in their entirety by reference.

BACKGROUND OF THE INVENTION

Field of the Invention

The object of the present invention refers to magnetic inductors having a geometry, produced with conductive, non-magnetic metal (such as, inter alia, copper, tin, aluminium, gold, or silver), preferably copper or a copper-based alloy, and to the method thereof for producing the magnetic inductor with EBM technology (electron beam melting/production technology based on electron beam fusion).

It is of particular use in the aerospace and automotive industries, in medicine, forging, railways, naval construction, etc.

Description of Related Art

Heating by means of induction is a process used for strengthening, joining or softening metals or other conductive materials. In modern manufacturing processes, heating by means of induction provides an appealing combination of speed, consistency, control and energy efficiency.

The magnetic inductor is the central piece for heating by means of induction since the alternating current going through it creates a variable magnetic field.

Therefore, the design of the magnetic inductor is one of the most important aspects of the heating installation. A well-designed magnetic inductor provides a correct pattern for heating parts, making the temperature uniform and maximising the efficiency of the power system as well as easily charging and discharging the parts. Producing traditional magnetic inductors is an exceptional process that is not industrialised, wherein the majority of magnetic inductors are custom manufactured individually in order to be adapted to the shape and size of the part to be subsequently heated up.

There is a proportional relationship between the current flowing through the magnetic inductor and the distance between the magnetic inductor and the part. Placing the part close to the magnetic inductor increases the current and the heat induced into the part. This relationship is known as the coupling efficiency of the magnetic inductor.

Magnetic inductors are usually produced with a copper tube that is very good at transmitting heat and electricity. Magnetic inductors are normally refrigerated using circulating water.

Up to now, there were known magnetic inductors produced using traditional methods wherein the raw materials of the copper tube are shaped according to the engineering specifications. This old-fashioned process makes it extremely difficult to produce identical magnetic inductors with the same working properties.

SUMMARY OF THE INVENTION

Magnetic inductors produced using EBM technology have the following advantages that magnetic inductors produced using traditional methods do not have:

The very high preheating conditions of the metal dust particles, ranging between 400 and 500° C. for the Cu, create finished magnetic inductors that have fewer deformations.

It is a clean process, that is, it has a lower risk of contamination of the melting bath and of the material than any other welding technique.

Since it is a vacuum technology it produces magnetic inductors made with neither oxides nor pores.

It can produce magnetic inductors with reactive materials and high rates of chemical purity.

The high energy density makes it possible to create magnetic inductors more quickly than with other additive manufacturing technologies that process metals and that have a higher geometry freedom.

It has an energy conversion efficiency of 65%, slightly higher than arc welding processes and much higher than laser.

The mechanical performances of magnetic inductors are high in comparison to other additive metal manufacturing process since this technology melts the preheated metal.

Vacuum melting produces melted materials with very high quality properties.

It can melt refractory metals and combinations of different metals.

Materials with 100% density (absence of pores).

Higher efficiency generating the electron beam, resulting in lower energy consumption, as well as lowering the cost of the installation and its maintenance.

Moving the electron beam is achieved without using mobile parts, resulting in a higher exploration speed and lower maintenance costs.

An environment with the proper thermal conditions reduces the residual tensions of the magnetic inductors produced, eliminating the usual cracks that result from using other technologies without having to add special ratios.

The loss of material is small, since the material can be removed from the processing platform and reused later on.

The present invention refers to a magnetic inductor for heating parts by means of induction. Said magnetic inductor has a density greater than or equal to 99.9% (absence of pores), and is produced by a plurality of welded layers formed by metal dust particles of a conductive, non-magnetic material, preferably copper or a copper-based alloy, having a spherical shape and a grain size between 40 and 100 µm, and in a single-piece part including electrical and mechanical connection means.

Additionally, the invention also describes a method for producing the magnetic inductor using a system comprising an electron gun, a vacuum chamber, a working chamber and a manipulation system.

Said method for producing the magnetic inductor comprises the following phases: generating and accelerating an electron beam in the electron gun that comprises a cathode, an electrode and an anode; generating electrons when the cathode is heated up as the electron beam goes through it, and accelerating and directing said electrons to the pre-perforated and positively charged anode; depositing, pressing and flattening a layer of metal dust particles preheated at temperatures between 350 and 700 degrees, where the metal dust particles comprise a conductive, non-magnetic material having a spherical shape and a grain size between 40 and 100 μm, on top of a building surface of the vacuum chamber of the machine; selectively melting the metal dust particles by means of the electron beam, producing the required section, which at the same is welded to the previously produced section; lowering the building surface to the width required by means of a riser, creating a new layer repeating the previous steps, and the process starts again to complete the construction of the magnetic inductor; cleaning the remaining metal dust particles off the surface of the magnetic inductor.

The preheating temperature of the metal dust particles is selected from a range between 400 and 500 degrees for copper.

The characteristics of the method for producing the magnetic inductor depend on the volume of the vacuum chamber and the heat provided by the electron beam.

The parameters controlling the amount of heat provided by the electron beam to the magnetic inductor are that the accelerating voltage between the anode and the cathode is of the order of 30-200 kV; the intensity of the electron beam is between 0.5 and 1500 mA; the diameter of the focus of the electron beam is between 0.25-1.5 mm; the welding speed depends on the volume of the vacuum chamber; and the vacuum chamber varies between $10^{-5}$ mbar and $10^{-3}$ mbar.

The technical characteristics of the machine used to carry out this production process are the following: the power of the electron beam is between 50 and 3000 W; the diameter of the electron beam is between 0.25 and 1.5 mm; the maximum manufacturing speed is between 20 and 60 $cm^3/h$.

The method for producing the magnetic inductor comprises applying finishing post-processes to the surface of the magnetic inductor depending on the material the magnetic inductor is made of. Said post-processes are selected between hot isostatic pressing and hot homogenisation.

Hot isostatic pressing subjects the material of the magnetic inductor to high temperatures, between 500 and 950 degrees, and to an isostatic gas pressure in a high pressure containment vessel, between 50 and 300 MPa, in order to reduce the porosity and increase the density of the material.

Hot homogenisation reduces the tensions and homogenises the micro-granulometry of the magnetic inductor.

BRIEF DESCRIPTION OF THE DRAWINGS

To complete the description and in order to give a better understanding of the characteristics of the invention, this descriptive report is accompanied by a series of drawings that are an integral part of the report, wherein, for illustration purposes and without limitation, the following has been represented.

Figure 1:
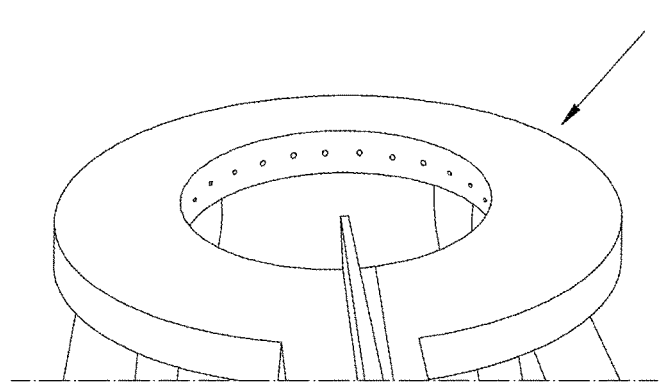
FIG. 1 shows a perspective view of one embodiment of a magnetic inductor according to the present invention.
Figure 2:
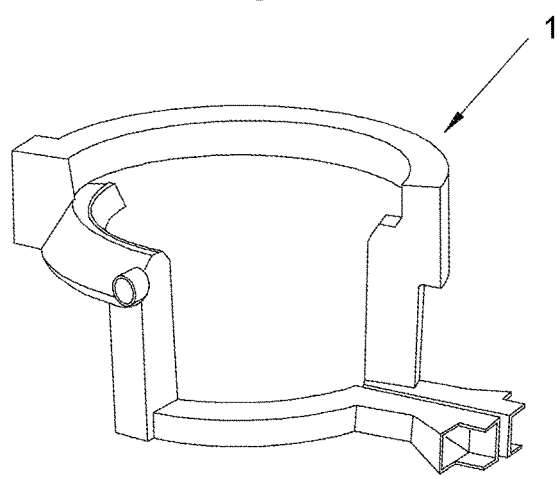
FIG. 2 shows a perspective view of a second embodiment of a magnetic inductor according to the present invention.
Figure 3:
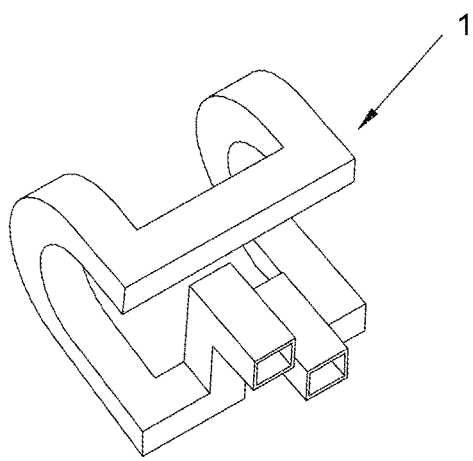
FIG. 3 shows a perspective view of a third embodiment of a magnetic inductor; according to the present invention.
Figure 4:
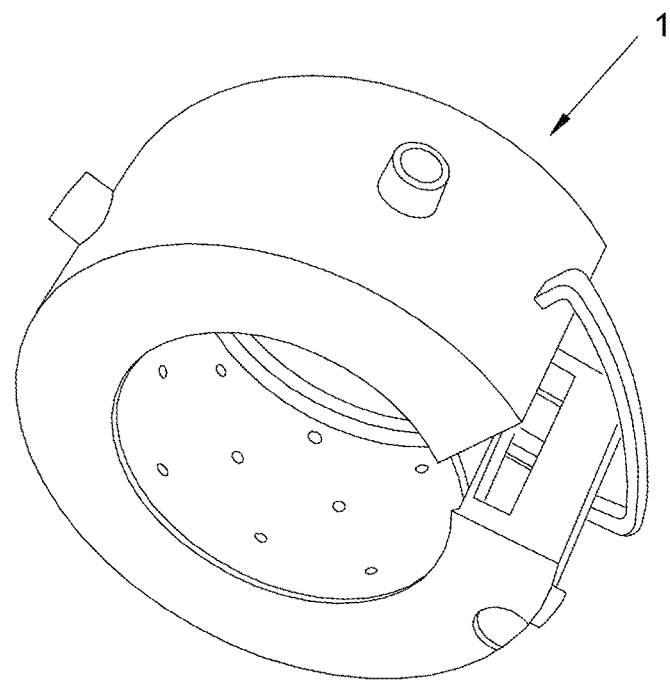
FIG. 4 shows a perspective view of a fourth embodiment of a magnetic inductor according to the present invention.
Figure 5:
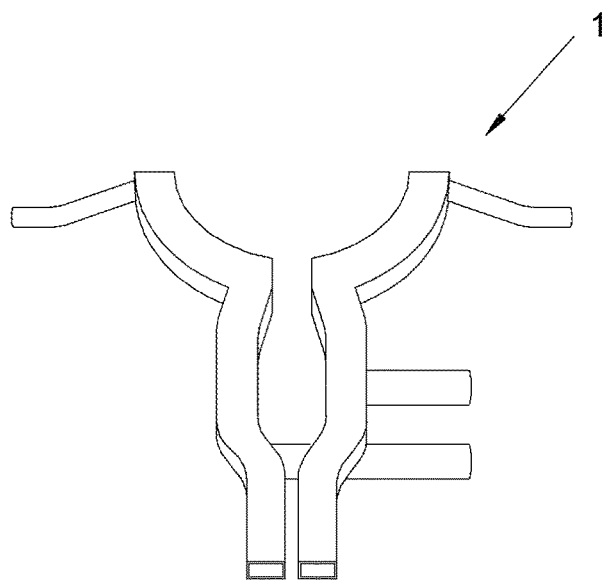
FIG. 5 shows a perspective view of a fifth embodiment of a magnetic inductor according to the present invention.

A list of the different components that have been represented in the drawings and that comprise the invention is detailed below:
1. Magnetic inductor.

DETAILED DESCRIPTION

The present invention refers to magnetic inductors (1) having a geometry, produced with conductive, non-magnetic material (such as, inter alia, copper, tin, aluminium, gold, or silver), preferably copper or a copper-based alloy, and the method for producing the magnetic inductor with EBM technology (electron beam melting).

Said EMB technology is a production technology using electron beams to manufacture the magnetic inductor (1), having any geometry no matter how complicated it may be, including shapes with cavities, also being able to generate the electrical and mechanical connection means such as the wings for electrical connection of the magnetic inductor (1), all at the same time, in a single-part made of copper.

The production of magnetic inductors (1) is carried out superimposing layers of molten metal dust particles (copper or a copper-based alloy, preferably with an amount of copper greater than or equal to 80%) in a vacuum chamber where an electron beam melts the metal dust particles deposited on the layers of a building surface following the exact geometry defined by a pre-designed CAD 3D model. Magnetic inductors (1) are produced with integrated refrigeration channels that act as heat exchanges and are used to refrigerate the magnetic inductor (1).

As mentioned above, said magnetic inductors (1) are designed using a CAD 3D program, and the file is transferred to a pre-processing software where the model is sectioned in said fine layers.

Once the magnetic inductor (1) is produced, it must be cleaned. If required, the magnetic inductor (1) can go through a mechanised process so it can be finished.

This production method using EBM technology has the advantage of producing high density (absence of pores) magnetic inductors (1), around 99.9% or greater, which results in high mechanical performance and high resistance to stresses, with identical or even improved metallurgic characteristics in comparison with magnetic inductors (1) created with conventional production processes. It can also be said that it is a variation of classic selective laser sintering, with the difference being the use of metal dust particles without adding elements of low melting point.

The system that is able to produce said magnetic inductors (1) using this type of EBM technology comprises at least the following components:

An electron gun: it is a chamber where a cathode, an anode and a control electrode are housed. The cathode is a refracting metal filament that is heated up to the emission temperature (2,500 K) as a result of a high intensity current going through it. The cathode has a negative voltage in relation to the anode that oscillates between 30 and 200 kV. This is the accelerating voltage that can speed up the electrons to velocities somewhat above half the speed of light. The control electrode is located between the cathode and the anode, and it is a cup electrode with a potential difference of between 1 and 2 kV in relation to the cathode.

The electron gun is in charge of concentrating and regulating the number of electrons. These electrons go through the anode toward the magnetic inductor (1). After leaving the anode, the electrodes tend to separate from each other due to the electromagnetic repulsion between charges of the same sign and due to their radial thermal agitation. This dispersion is corrected by means of the focusing system comprising a coil that creates a magnetic field that corrects the trajectory of the electrons.

A vacuum system: it is a chamber where the electron gun is housed, and where the vacuum is created to prevent the electron beam from dispersing through the air molecules.

A working chamber: this is the place housing the magnetic inductors (1) that are going to be welded. The size and shape of these chambers are two variables that must be taken into account since the larger the dimensions the longer it will take to reach the vacuum conditions required. Additionally, the smaller its dimensions the more limited will be the dimensions of the magnetic inductors (1) that can be welded.

Manipulation systems: due to the working conditions of these equipments it is necessary to provide them with systems that are able to manipulate the magnetic inductor (1) all throughout the process. One example is the numerical control systems that give the magnetic inductor (1) longitudinal and rotational movement in relation to the electron beam. This makes it possible to ensure that movements can be repeated, which is necessary in assembly line production processes.

The following process takes place:

The electron beam, which is characteristic of this method for producing magnetic inductors (1), is generated and accelerated in the electron gun comprising the cathode (tungsten filament), the control electrode and the anode. The electrons are generated when the cathode is heated up as a result of an electric current going through it (the current of the electron beam), and they are accelerated and directed to the anode, which is perforated and positively charged. The electrons comprising the beam thus have a high speed since they have been accelerated in an electrostatic field with a high potential difference, and the magnetic fields created by electromagnetic coils are able to organise the electron beam in the desired shape and direct it toward the magnetic inductor (1) being made. The kinetic energy possessed by the electrons is turned into heat as they collide with the magnetic inductor (1) being made, facilitating the formation of the so-called "keyhole", which makes it possible to weld the magnetic inductor (1).

The electromagnetic coils used in EBM technology make it possible to provide the high energy being used and that will provide a high melting point capability and high productivity.

The method of production is carried out in the chamber where a vacuum is created to prevent the material from oxidising, and it involves the following phases:

a. depositing, pressing and flattening a layer of metal dust particles preheated at high temperatures between 350 and 700 degrees, preferably between 400 and 500° C. for the Cu, on the building surface of the machine;

b. focusing the electron beam using a system of electromagnetic coils in the XY plane and selectively melting the metal dust particles, producing the desired section at the same time it is welded to the previous one;

c. lowering the building surface to the desired width by means of a riser, creating a new layer repeating the steps, and the process starts again in order to complete the construction of the magnetic inductor (1);

d. improving the surface of the magnetic inductor (1) by projecting sand on it, by the classic manual finish or by means of mechanical post-processes.

Since it is a closed method for production, a great proportion of unused metal dust particles (97%) that remain on the building surface can be recovered, as well as the metal dust particles removed from the finished magnetic inductor (1), either using the method of suction or blowing.

The characteristics of the method for producing the magnetic inductor depend on the volume of the vacuum chamber and the heat provided by the electron beam.

The parameters controlling the amount of heat provided by the electron beam to the magnetic inductor (1) being made are:

the acceleration voltage between the anode and the cathode is of the order of 30-200 kV, the intensity of the electron beam is between 0.5 and 1500 mA, the diameter of the focus of the electron beam is 0.25-1.5 mm, the welding speed is subjected to the volume of the vacuum chamber, the vacuum chamber oscillates between $10^{-5}$ mbar and $10^{-3}$ mbar, providing a minimum base pressure of $1\times10^{-5}$ throughout the entire generation cycle, and during the process of real melting it provides partial pressures of $2\times10^{-3}$ mbar, which ensure a clean and controlled environment that is key to maintaining the chemical specification of the material incorporated.

The metal dust particles used to produce the magnetic inductors (1) must be of a conductive, non-magnetic material (copper, tin, aluminium, gold, silver), preferably copper or a copper-based alloy, having a spherical shape and a grain size preferably between 40 and 100 μm.

The technical characteristics of the machine used to apply this method of production are as follows:

Maximum building measurements: 250*250*400 mm or 350*350*250 mm, power of the electron beam: between 50 and 3000 W, continuously variable, Diameter of the electron beam: 0.25-1.5 mm Maximum production speed: 20 to 60 cm$^3$/h, depending on the material, vacuum pressure: oscillating between $10^{-5}$ mbar and $10^{-3}$ mbar, power feed: 3*400V, 32 A, 7 kW, type of file: STL, size and weight of the machine: 1.850*900*2.200 mms (W*D*H), 1.420 kg.

Thanks to this new method of production, the process of making magnetic inductors (1) becomes an industrialised process so that magnetic inductors (1) can be produced in an assembly line in an efficient and fast way. Additionally, this method of production makes it possible to manufacture identical magnetic inductors (1), thus making it possible to duplicate inductors and improve their consistency when there are several systems or machines executing the same process, and it reduces significantly the maintenance and calibration time needed when the magnetic inductors (1) have to replaced. In addition, producing the magnetic inductors (1) in a vacuum involves less oxygen and therefore less oxidation.

The structural qualities of the magnetic inductors (1) can be improved by applying post-processes depending on the type of material used. Some of these treatments include:

HIP, Hot Isostatic Pressing: production process used to reduce the porosity of metals and increase the density of many materials, improving their machinability and mechanical properties. The HIP process subjects the material to high temperatures, between 500 and 950 degrees, and to an isostatic gas pressure in a high pressure containment vessel, between 50 and 300 MPa.

The pressurised gas most commonly used is argon, since it is an inert gas, so that the material does not have chemical reactions to it.

HOM, Heat homogenization: process applied to reduce the tensions and homogenise the micro-granulometry of the magnetic inductor (1).

The present invention is not limited by the embodiment disclosed herein. Other embodiments can be made by persons skilled in the art in light of this description. In consequence, the scope of the invention is defined by the following claims.

The invention claimed is:

1. A method for producing a magnetic inductor, using a system comprising an electron gun, a vacuum chamber, a working chamber and a manipulation system, the method comprising:
    a. generating and accelerating an electron beam in the electron gun that comprises a cathode, an electrode and an anode;
    b. generating electrons when the cathode is heated up as the beam of electrons passes through the cathode, and accelerating and directing said electrons to the pre-perforated and positively charged anode;
    c. depositing, pressing and flattening a first layer of metal dust particles preheated at a temperature between 350 and 700 degrees C., where the metal dust particles comprise a conductive, non-magnetic material having a spherical shape and a grain size between 40 and 100 µm, on top of a building surface of the vacuum chamber;
    d. selectively melting the metal dust particles using the electron beam, producing a first section, which at the same is welded to a previously produced section;
    e. lowering the building surface using a riser, creating another layer and repeating the steps a) to d);
    f. repeating steps a) to e) to complete the construction of the magnetic inductor; and
    g. cleaning the remaining metal dust particles from the surface of the magnetic inductor.

2. The method for producing the magnetic inductor according to claim 1, wherein the preheating temperature for the metal dust particles is between 400 and 500 degrees C. and the metal dust particles comprise copper.

3. The method for producing the magnetic inductor according to claim 1, wherein an acceleration voltage between the anode and the cathode is between 30 and 200 kV.

4. The method for producing the magnetic inductor according to claim 3, wherein an intensity of the electron beam is between 0.5 and 1500 mA.

5. The method for producing the magnetic inductor according to claim 4, wherein the diameter of a focus of the electron beam is between 0.25 and 1.5 mm.

6. The method for producing the magnetic inductor according to claim 5, wherein a vacuum pressure is between $10^{-5}$ mbar and $10^{-3}$ mbar.

7. The method for producing the magnetic inductor according to claim 6, wherein a power of the electron beam is between 50 and 3000 W.

8. The method for producing the magnetic inductor according to claim 7, wherein a maximum production speed is between 20 and 60 cm$^3$/h.

9. The method for producing the magnetic inductor according to claim 1, further comprising applying finishing post-processes to the surface of the magnetic inductor depending on the material the magnetic inductor is made of.

10. The method for producing the magnetic inductor according to claim 9, wherein the post-processes applied to the magnetic inductor are selected from the group consisting of hot isostatic pressing and hot homogenisation.

11. The method for producing the magnetic inductor according to claim 10, wherein the hot isostatic pressing process subjects the material of the magnetic inductor to high temperatures, between 500 and 950 degrees C., and to an isostatic gas pressure in a high pressure containment vessel, between 50 and 300 MPa.

* * * * *